United States Patent
Xu et al.

(10) Patent No.: US 9,817,039 B2
(45) Date of Patent: Nov. 14, 2017

(54) METHODS FOR SENSING CURRENT IN A SWITCHING REGULATOR

(75) Inventors: Peng Xu, San Jose, CA (US); Francis Yu, Sunnyvale, CA (US)

(73) Assignee: MONOLITHIC POWER SYSTEMS, INC., San Jose, CA (US)

( * ) Notice: Subject to any disclaimer, the term of this patent is extended or adjusted under 35 U.S.C. 154(b) by 1812 days.

(21) Appl. No.: 13/249,128

(22) Filed: Sep. 29, 2011

(65) Prior Publication Data

US 2013/0082689 A1    Apr. 4, 2013

(51) Int. Cl.
  *G01R 17/00*  (2006.01)
  *G01R 19/00*  (2006.01)
(52) U.S. Cl.
  CPC ................. *G01R 19/0092* (2013.01)
(58) Field of Classification Search
  CPC .......... G01R 19/0092; G01R 19/16519; G01R 31/3004; H03F 2200/261; H03F 2200/252; H03F 2200/462
  USPC .................... 324/123 R, 76.11, 76.18, 123 C
  See application file for complete search history.

(56) References Cited

U.S. PATENT DOCUMENTS

| | | | | | |
|---|---|---|---|---|---|
| 3,919,994 | A | * | 11/1975 | Munden | F02P 3/0453 123/211 |
| 5,345,307 | A | * | 9/1994 | Ishigami | G01C 19/726 356/464 |
| 5,999,041 | A | * | 12/1999 | Nagata | H03K 17/0822 327/108 |
| 6,009,000 | A | * | 12/1999 | Siri | H02J 1/102 363/21.09 |
| 6,044,295 | A | * | 3/2000 | Pilz | A61N 1/378 607/29 |
| 6,713,823 | B1 | | 3/2004 | Nickel | |
| 7,710,084 | B1 | * | 5/2010 | Guo | G01R 19/003 323/224 |

(Continued)

OTHER PUBLICATIONS

Zhou, X. et al., "A Novel Current-Sharing Control Technique for Low-Voltage High-Current Voltage Regulator Module Applications" IEEE Transactions on Power Electronics, Nov. 2000, vol. 15, No. 6, pp. 1153-1162.

(Continued)

*Primary Examiner* — Giovanni Astacio-Oquendo
(74) *Attorney, Agent, or Firm* — Zilka Kotab, P.C.

(57) ABSTRACT

In one embodiment, a current sensing circuit includes a differential current sensing amplifier adapted for sensing a voltage drop across a main transistor, the differential current sensing amplifier being adapted for providing a switched current output to a timing circuit which is adapted for providing a timing signal to one or more switching current sample-and-hold circuits based on a current waveform of the switched current output, and the one or more switching current sample-and-hold circuits, each of which are adapted for producing a substantially continuous output current. In another embodiment, a method for detecting a current includes driving a main transistor with a first current, driving one or more sensing transistors with a second current, measuring a sensing inductor current of the one or more sensing transistors, and determining the first current based on the sensing inductor current, wherein the sensing inductor current is related to the first current.

17 Claims, 5 Drawing Sheets

(56) References Cited

U.S. PATENT DOCUMENTS

| | | | | |
|---|---|---|---|---|
| 2002/0116100 | A1* | 8/2002 | Shimazaki | B60L 11/1807 |
| | | | | 701/22 |
| 2002/0181141 | A1* | 12/2002 | Kuroiwa | G11B 5/5526 |
| | | | | 360/77.02 |
| 2003/0006749 | A1* | 1/2003 | Rollman | G01R 19/25 |
| | | | | 324/76.11 |
| 2009/0206806 | A1* | 8/2009 | Kamatani | H03F 3/45179 |
| | | | | 323/273 |
| 2011/0080773 | A1* | 4/2011 | El Baraji | G11C 7/067 |
| | | | | 365/158 |
| 2011/0115471 | A1* | 5/2011 | Sato | G01R 19/0092 |
| | | | | 324/123 R |
| 2011/0204859 | A1* | 8/2011 | Prodic | H02M 3/1588 |
| | | | | 323/271 |

OTHER PUBLICATIONS

MPS, MP8620, 25A, 16V, Rev. 1.1, Fully Integrated Synchronous Buck, Monolithic Power, Sep. 21, 2011.

* cited by examiner

METHODS FOR SENSING CURRENT IN A SWITCHING REGULATOR

FIELD OF THE INVENTION

The present invention relates generally to switching regulators, and particularly to low voltage high current switching regulators and methods of production thereof.

BACKGROUND

A switching regulator, such as one used for voltage regulation for a microprocessor, typically requires the output current to be sensed in some way. Conventionally, this current is sensed in a way that introduces a significant amount of noise into the sensing operation, thereby producing a low signal-to-noise ratio (SNR), which is undesirable.

Thus, it would be advantageous to provide current sensing which can be used in a switching regulator that is capable of providing a sensed current signal with a much higher SNR than conventional devices.

SUMMARY OF INVENTION

In one embodiment, a current sensing circuit includes a differential current sensing amplifier adapted for sensing a voltage drop across a main transistor, the differential current sensing amplifier being adapted for providing a switched current output to a timing circuit, the timing circuit which is adapted for providing a timing signal to one or more switching current sample-and-hold circuits based on a current waveform of the switched current output, and the one or more switching current sample-and-hold circuits, each of which are adapted for producing a substantially continuous output current.

In another embodiment, a method for detecting a current includes driving a main transistor with a first current, driving one or more sensing transistors with a second current, measuring a sensing inductor current of the one or more sensing transistors, and determining the first current based on the sensing inductor current, wherein the sensing inductor current is related to the first current.

In another embodiment, a current sensing circuit includes a differential current sensing amplifier adapted for sensing a voltage drop across a main transistor, the differential current sensing amplifier being adapted for providing a switched current output to a timing circuit, wherein the differential current sensing amplifier includes the main transistor adapted for producing a main transistor current and one or more sensing transistors, each sensing transistor being adapted for producing a sensing inductor current, wherein the sensing inductor current is smaller than and related to the main transistor current, the timing circuit which is adapted for providing a timing signal to one or more switching current sample-and-hold circuits based on a current waveform of the switched current output, wherein the timing circuit provides two ramps having a negative relationship to one another, and the one or more switching current sample-and-hold circuits, each of which are adapted for producing a substantially continuous output current, wherein each of the switching current sample-and hold circuits includes a first sample-and-hold loop, the first sample-and-hold loop being adapted for latching onto an average value of a sensing inductor current provided by at least one sensing transistor, and a second sample-and-hold loop, the second sample-and-hold loop being adapted for detecting the average value of the sensing inductor current provided by the at least one sensing transistor.

BRIEF DESCRIPTION OF THE DRAWINGS

The present invention can be further understood with reference to the following detailed description and the appended drawings, wherein like elements are provided with like reference signs.

DETAILED DESCRIPTION

Figure 1:
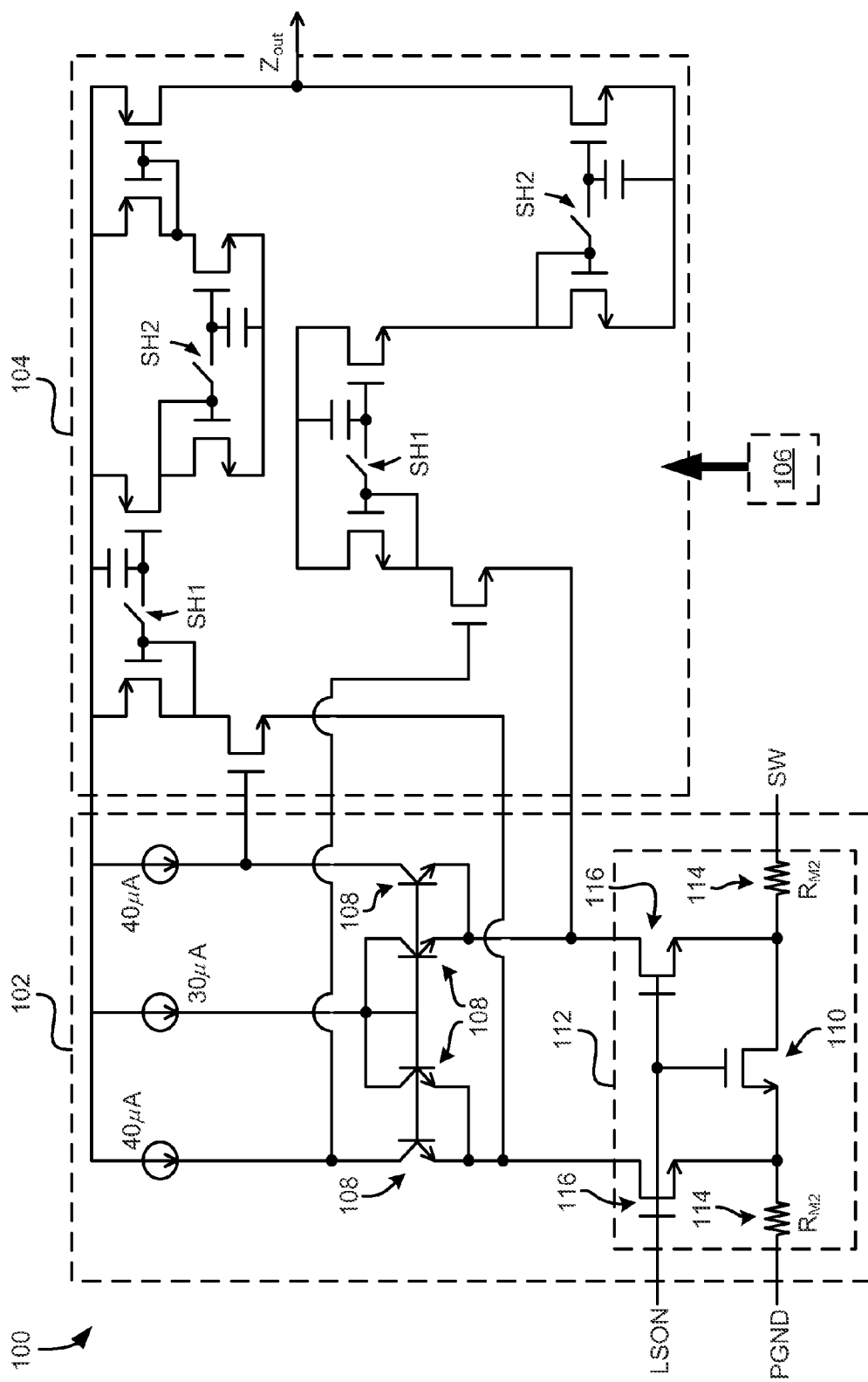
FIG. 1 shows a low side current sensing circuit, according to one embodiment.

For switching regulators used in low voltage high current microprocessor applications, accurate and fast average inductor current is needed for real-time current monitoring and/or adaptive voltage position. Low voltage and high current switching regulators used for powering microprocessors now have increased current density and better efficiency requirements. Therefore, commonly used inductor direct-current resistance (DCR) sensing becomes more difficult to perform due to a reduced signal-to-noise ratio (SNR) and better accuracy requirements. A method and a circuit which accurately sense an average inductor current in a cycle-by-cycle basis are introduced and described below, according to various embodiments.

In one general embodiment, a current sensing circuit includes a differential current sensing amplifier adapted for sensing a voltage drop across a main transistor, the differential current sensing amplifier being adapted for providing a switched current output to a timing circuit, the timing circuit which is adapted for providing a timing signal to one or more switching current sample-and-hold circuits based on a current waveform of the switched current output, and the one or more switching current sample-and-hold circuits, each of which are adapted for producing a substantially continuous output current.

In another general embodiment, a method for detecting a current includes driving a main transistor with a first current, driving one or more sensing transistors with a second current, measuring a sensing inductor current of the one or more sensing transistors, and determining the first current based on the sensing inductor current, wherein the sensing inductor current is related to the first current.

In another general embodiment, a current sensing circuit includes a differential current sensing amplifier adapted for sensing a voltage drop across a main transistor, the differential current sensing amplifier being adapted for providing a switched current output to a timing circuit, wherein the differential current sensing amplifier includes the main transistor adapted for producing a main transistor current and one or more sensing transistors, each sensing transistor being adapted for producing a sensing inductor current, wherein the sensing inductor current is smaller than and related to the main transistor current, the timing circuit which is adapted for providing a timing signal to one or more switching current sample-and-hold circuits based on a current waveform of the switched current output, wherein the timing circuit provides two ramps having a negative relationship to one another, and the one or more switching current sample-and-hold circuits, each of which are adapted for producing a substantially continuous output current, wherein each of the switching current sample-and hold circuits includes a first sample-and-hold loop, the first sample-and-hold loop being adapted for latching onto an average value of a sensing inductor current provided by at least one sensing transistor, and a second sample-and-hold loop, the second sample-and-hold loop being adapted for detecting the average value of the sensing inductor current provided by the at least one sensing transistor.

Referring to FIG. 1, a low side current sensing circuit 100 is shown, according to one embodiment. The low side current sensing circuit 100 includes a differential current sensing amplifier 102, switching current sample and hold (S/H) circuits 104, and a timing circuit 106 for detecting a center of a dynamic pulse width modulation (PWM) waveform.

The differential current sensing amplifier 102 includes four npn transistors 108, two of which are being supplied their own 40 μA signals, and two of which are sharing a 30 μA signal. The differential current sensing amplifier 102 senses a voltage drop of a main field-effect transistor (FET) 110 and replicates a switching current on a matched sensing FET 112. This method of differential sensing eliminates any mismatch of M2 resistance 114 between the sensing FET 112 and the main FET 110, and therefore provides better accuracy than conventional sensing schemes, such as inductor DCR sensing.

Because of the layout, where the current being sensed passes through the transistor layout micro resistance ($R_{M2}$, 114), ($R_{M2}$, 114), the main FET 110 is quite large and eventually must be tied to an output terminal, which is indicated by PGND and SW.

Because of the large size of the main FET 110, there is a lot of distribution metal resistance, indicated by $R_{M2}$ 114, which basically is the layout of the metal, e.g., how routing from the terminal to each individual transistor is performed. The signal provided across the main FET 110 is LSON, which is tied to the two transistors 116 which comprise the sensing FET 112, which basically is a flow section of the main FET 110. Each of the two transistors 116 may be constructed in a similar way and are generally buried inside the main FET 110, although other arrangements are possible as would be understood by one of skill in the art upon reading the present descriptions.

The differential current sensing amplifier 102 uses the two sensing transistors 116 which comprise the sensing FET 112, which together comprise a small section of the main FET 110, so that the sensing transistors 116 are substantially matched. In one embodiment, they are the same type of transistor as the main FET 110, but just have a different size. Therefore, the current that goes through the main FET 110, along with the sensor amplifier current which may be used to duplicate the small current in the small sensor transistors 116 forming the sensing FET 112 may be used to determine the current of a MOSFET or any other device coupled thereto. This causes the current of the two sensing transistors 116 which comprise the sensing FET 112 to be proportional to the current of the main FET 110. In one exemplary embodiment, if the main FET 110 has a current of 20 A, the two sensing transistors 116 which comprise the sensing FET 112 may receive a current of about 200 μA each, which has a proportional relationship to the current of the main FET 110, in this case represented by a ratio of 1:10,000. Of course, other relationships may exist between the main FET 110 current and the sensed current through the sensing FET 112, such as a function of the current through the main FET 110, a derivative of the current through the main FET 110, an inverse of the current through the main FET 110, etc. In this way, the current information of the main transistor 110 may be determined by sensing the current of the sensing FET 112, with the knowledge of the relationship between the two.

The switching current sample and hold (S/H) circuits 104 are capable of sampling and holding a metal-oxide-semiconductor (MOS) gate voltage, according to one embodiment. The first S/H circuit, which includes one SH1, latches on to an average value of the sensing inductor current from one of the sensing FETs 116, and a second S/H circuit, which includes one SH2 in series with the first S/H circuit, detects an average value of the sensing inductor current from both of the sensing FETs 116.

The averaged output current Zout is a continuous current; however, the switch current is not continuous, since the current is progressing through a switch, current is only available when the switch is on. When the switch is off, substantially no current is available to sense. Therefore, the current that is sensed at the differential current sensing amplifier 102 is a pulse current. Accordingly, the current that can be sensed from the switch is similar to a pulsed waveform. In order to achieve a continuous waveform from which to sense the current at any given time, a sample and hold circuit is used, such that when the switch is on, the current is read normally, and when the switch is off, the current value sensed when the switch was on is held, so that it can be sensed when the switch is off. In this way, a substantially continuous averaged output current Zout may be achieved using the switching current S/H circuits 104.

Figure 2A:
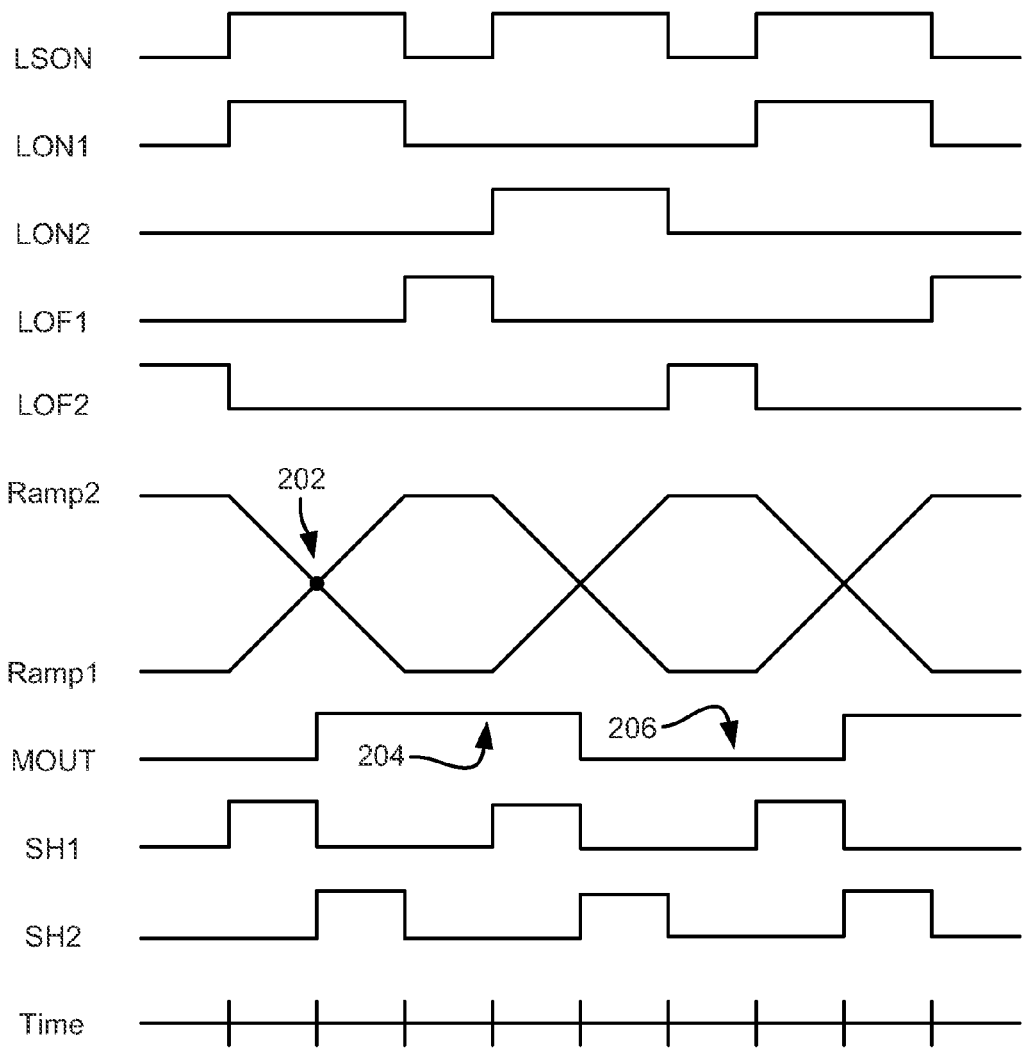
FIG. 2A shows several signals that may be used with a low side current sensing circuit, according to one embodiment.
Figure 2B:
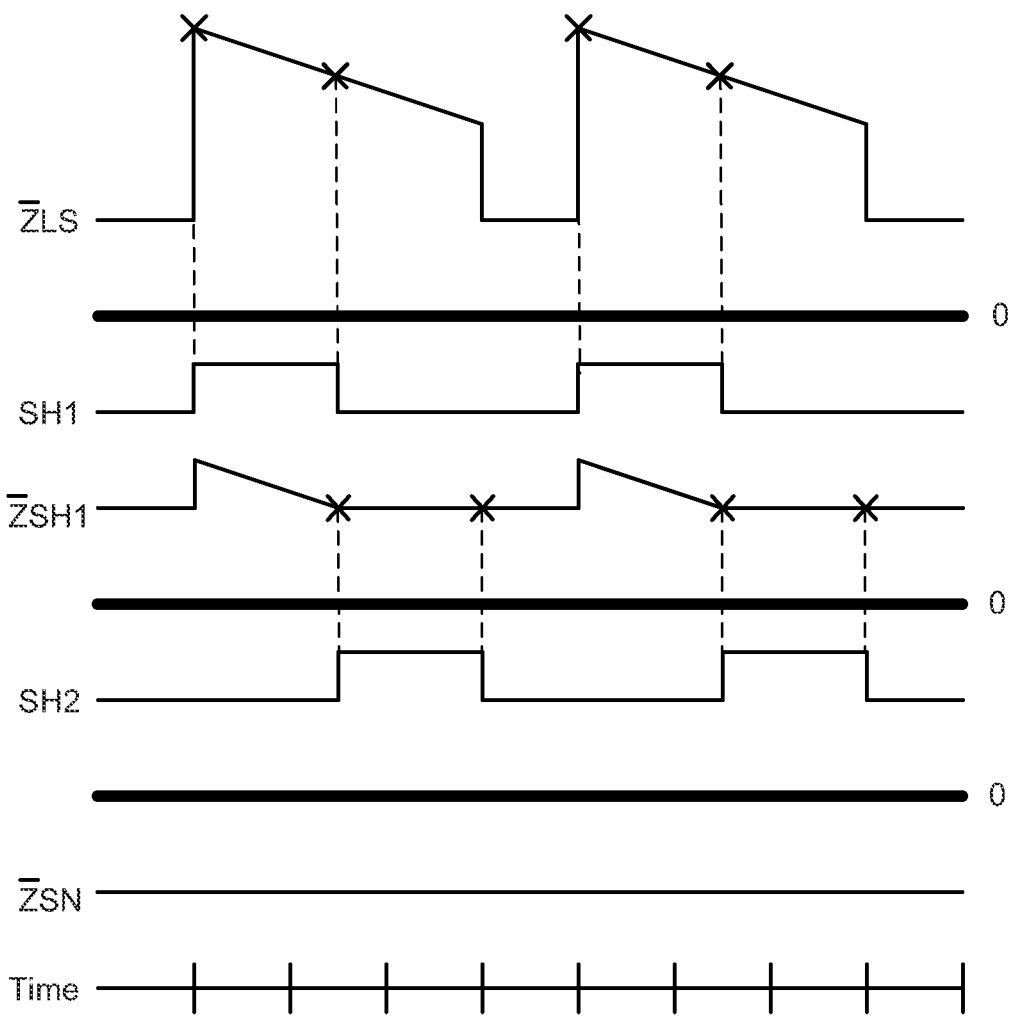
FIG. 2B shows how signals in a low side current sensing circuit may be used to provide a continuous output current, according to one embodiment.

The timing circuit 106 produces two ramps which are generated based on dynamic PWM waveforms. As shown in FIG. 2, according to one exemplary embodiment, a first ramp (Ramp1) is upward and a second ramp (Ramp2) is downward, at the same time, and vice versa at other times. The crossover point of the two ramps 202 represents a center point of the PWM waveform, which may be detected based on the crossover point 202 of the two ramps (Ramp1 and Ramp2). Since the current at the switch (MOUT) is a pulsing current with a zero period, there is an up period 204 and a down period 206. As FIGS. 2A-2B illustrate, when the low side turn on signal (LSON, which is the sum of LON1+LON2) is on, the output current (averaged RLS) is dropping, and when the switch is off (the sum of LOF1+LOF2), the current rises. This is due to the ripple current at the output; however, the center value of the ripple current may be used as a continuous current output, in one approach.

Referring again to FIGS. 2A-2B, because the center value is the value for the output current when SH1 is about equal to SH2, basically the center value is the sample moment of how the center portion may be obtained. So for SH1, for the first sample, the first push is off of that, but due to the sample window, which is when SH1 current is at a maximum, a more accurate signal is observed, with a little variation. The variation (which resembles a bump) may be removed, since it does not denote the average current, by using SH2. Therefore, RSH1 is only sampled when the signal is flat, and by sampling RSH1 during the SH2 window, which is when SH2 current is at a maximum, RSN is computed, which is a spare signal, and the value is actually the center point of the RSH1, which provides an averaged current output for multiple sample and hold circuits.

Referring again to FIG. 2A, the timing circuit may be used to detect the center of the output current waveform signal. The waveform on the low side current sensing timing circuit includes LSON, which is basically the low side turn on signal. Signals LON1 and LON2 are derived from the low side turn on signal LSON by each signal alternately skipping one pulse. Therefore, the low side turn on signal LSON is split into two phases with the signal max phase being shifted. In this way, LOF1 and LOF2 are generated, which are the reverse of LON1 and LON2, respectively. Accordingly, the ramp signal generates two ramps (Ramp1 and Ramp2), which have a negative relationship. When these two ramps (Ramp1 and Ramp2) intersect, at point 202, the half wave of the waveform signal is capable of being determined.

Figure 3:
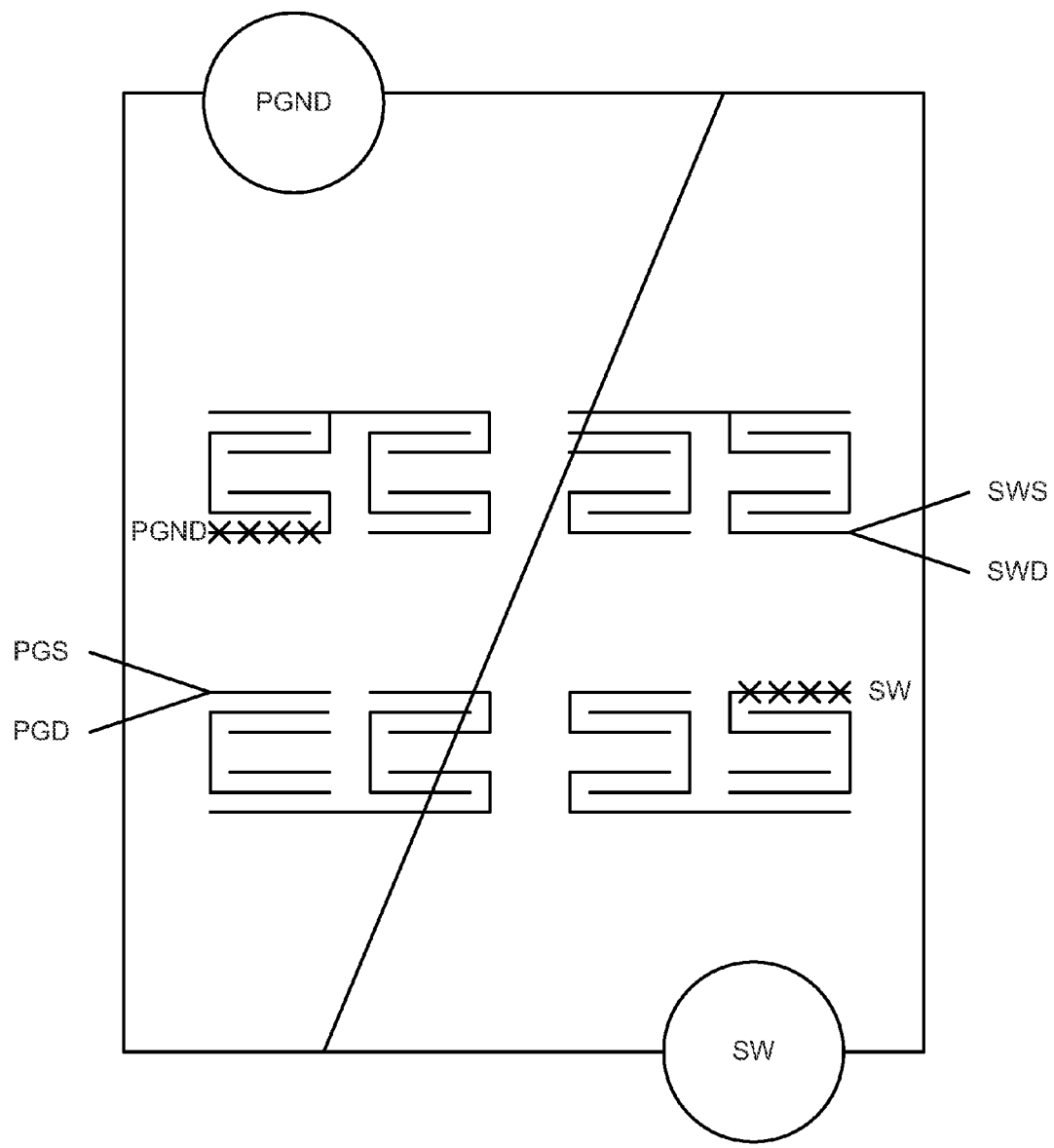
FIG. 3 shows a circuit layout, according to one embodiment.

Now referring to FIG. 3, a layout of a circuit that may be used with a low side current sensing circuit is shown, according to one embodiment. The PGND and SW circles near the top and bottom of the layout are the output terminals of the main transistor, and the angled line across the layout is the power transistor. The two snaked structures above and below the center of the layout are the two small transistors, which are two small sensing FETs.

Figure 4:
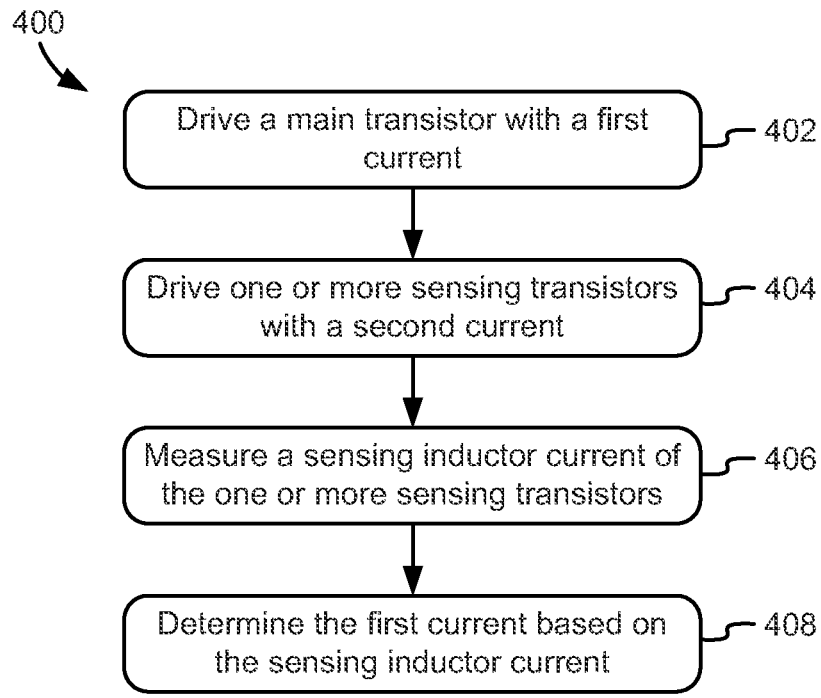
FIG. 4 shows a flowchart of a method, according to one embodiment.

In FIG. 4, a method 400 for detecting a current is shown according to one embodiment. The method 400 may be carried out in any desired environment, such as those described in FIGS. 1-3, according to various embodiments.

In operation 402, a main transistor is driven with a first current. In most embodiments, the first current is a current which is to be detected.

In operation 404, one or more sensing transistors is driven with second current. In some embodiments, the second current is less than and related to the first current.

In operation 406, a sensing inductor current of the one or more sensing transistors is measured. Any method known in the art may be used to measure the current.

In operation 408, the first current is determined based on the sensing inductor current, since the sensing inductor current is related to the first current.

In some approaches, the method 400 may further include repeating the measuring of the sensing inductor current of the one or more sensing transistors at least once more and averaging all measurements to improve at least one of measurement accuracy and measurement precision. In some cases, the measurement accuracy and the measurement precision may be improved by at least about 1.0 order of magnitude, 10 orders of magnitude, etc.

In some embodiments, method 400 may be combined with method 500, described below.

Figure 5:
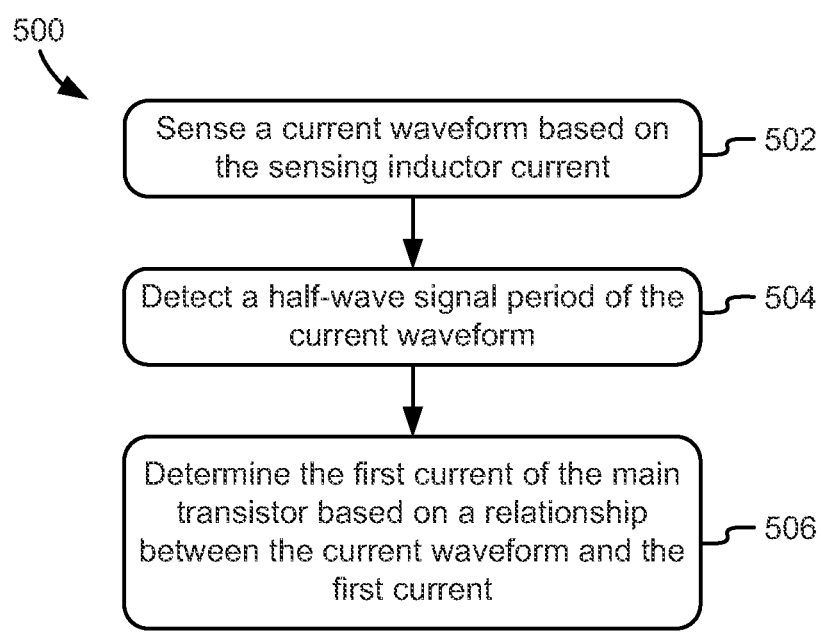
FIG. 5 shows a flowchart of another method, according to one embodiment.

In FIG. 5, a method 500 for detecting a current is shown according to one embodiment. The method 500 may be carried out in any desired environment, such as those described in FIGS. 1-4, according to various embodiments.

In operation 502, a current waveform based on the sensing inductor current is sensed. The current waveform, in some approaches, may be a pulse-width-modulation (PWM) waveform.

In operation 504, a half-wave signal period of the current waveform is detected, which provides an average value for the waveform.

In operation 506, the first current of the main transistor is determined based on a relationship between the current waveform and the first current.

Of course, any of the above described embodiments may be carried out in combination, with more or less operations, in described environments, such as that depicted in FIG. 1, according to one embodiment, etc., and the scope of the invention is not limited to those embodiments specifically described herein.

What is claimed is:

1. A current sensing circuit, comprising:
a differential current sensing amplifier adapted for sensing a voltage drop across a main transistor, the differential current sensing amplifier being adapted for providing a switched current output to a timing circuit;
the timing circuit, wherein the timing circuit is adapted for providing a timing signal to one or more switching current sample-and-hold circuits based on a current waveform of the switched current output; and
the one or more switching current sample-and-hold circuits, each of the one or more switching current sample-and-hold circuits being adapted for producing a continuous output current, wherein each of the switching current sample-and hold circuits comprises:
a first sample-and-hold loop, the first sample-and-hold loop being adapted for latching onto an average value of a sensing inductor current provided by at least one sensing transistor; and
a second sample-and-hold loop, the second sample-and-hold loop being adapted for detecting the average value of the sensing inductor current provided by the at least one sensing transistor.

2. The current sensing circuit as recited in claim 1, wherein the differential current sensing amplifier comprises:
the main transistor; and
the at least one sensing transistor, each sensing transistor being adapted for providing a sensing inductor current.

3. The current sensing circuit as recited in claim 2, wherein the main transistor and each of the at least one sensing transistors are field-effect transistors (FET).

4. The current sensing circuit as recited in claim 2, wherein the at least one sensing transistors are matching or substantially of a same type of transistor.

5. The current sensing circuit as recited in claim 2, wherein the main transistor is a larger size of a same type of transistor as each of the at least one sensing transistors.

6. The current sensing circuit as recited in claim 2, wherein the at least one sensing transistors comprise a flow section of the main transistor such that a sensing transistor accuracy and a sensing transistor precision are improved.

7. The current sensing circuit as recited in claim 6, wherein the sensing transistor accuracy and the sensing transistor precision are improved by at least about 1.0 order of magnitude.

8. The current sensing circuit as recited in claim 1, wherein the timing circuit provides two ramps having a negative relationship to one another, and wherein the timing circuit indicates a crossover point of the ramps for detection of a half-wave signal period of the current waveform.

9. The current sensing circuit as recited in claim 8, wherein the waveform is a pulse-width-modulation (PWM) waveform.

10. A current sensing circuit, comprising:
a differential current sensing amplifier adapted for sensing a voltage drop across a main transistor, the differential current sensing amplifier being adapted for providing a switched current output to a timing circuit, wherein the differential current sensing amplifier comprises:
the main transistor adapted for producing a main transistor current; and one or more sensing transistors, each sensing transistor being adapted for producing a sensing inductor current, wherein the sensing inductor current is smaller than and related to the main transistor current;

the timing circuit, wherein the timing circuit is adapted for providing a timing signal to one or more switching current sample-and-hold circuits based on a current waveform of the switched current output, wherein the timing circuit provides two ramps having a negative relationship to one another; and the one or more switching current sample-and-hold circuits, each of the one or more switching current sample-and-hold circuits being adapted for producing a continuous output current, wherein each of the switching current sample-and hold circuits comprises:

a first sample-and-hold loop, the first sample-and-hold loop being adapted for latching onto an average value of a sensing inductor current provided by at least one sensing transistor; and a second sample-and-hold loop, the second sample-and-hold loop being adapted for detecting the average value of the sensing inductor current provided by the at least one sensing transistor.

11. The current sensing circuit as recited in claim 10, wherein the main transistor and each of the one or more sensing transistors are field-effect transistors (FET).

12. The current sensing circuit as recited in claim 10, wherein each of the one or more sensing transistors are matching or substantially of a same type.

13. The current sensing circuit as recited in claim 10, wherein the main transistor is a larger size of a same type of transistor as each of the one or more sensing transistors.

14. The current sensing circuit as recited in claim 10, wherein the one or more sensing transistors comprise a flow section of the main transistor such that a sensing transistor accuracy and a sensing transistor precision are improved.

15. The current sensing circuit as recited in claim 14, wherein the sensing transistor accuracy and the sensing transistor precision are improved by at least about 1.0 order of magnitude.

16. The current sensing circuit as recited in claim 10, wherein the timing circuit indicates a crossover point of the ramps for detection of a half-wave signal period of the current waveform.

17. The current sensing circuit as recited in claim 16, wherein the waveform is a pulse-width-modulation (PWM) waveform.

* * * * *